US009676517B2

(12) United States Patent
Jiang et al.

(10) Patent No.: US 9,676,517 B2
(45) Date of Patent: Jun. 13, 2017

(54) SERVER PACKING ASSEMBLY (71) Applicant: Wistron Corporation, New Taipei (TW)

(72) Inventors: Jheng-Ying Jiang, New Taipei (TW); Sun-Lai Chang, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 14/749,127

(22) Filed: Jun. 24, 2015

(65) Prior Publication Data

US 2016/0107793 A1 Apr. 21, 2016

(30) Foreign Application Priority Data

Oct. 15, 2014 (TW) .............................. 103135646 A (51) Int. Cl.
*B65D 19/44* (2006.01)
*B65D 19/42* (2006.01)
(Continued)

(52) U.S. Cl.
CPC ......... *B65D 19/44* (2013.01); *B65D 19/0073* (2013.01); *B65D 19/42* (2013.01);
(Continued)

(58) Field of Classification Search
CPC .... A47B 91/00; B65D 19/0073; B65D 19/42; B65D 19/44; B65D 81/02; B65D 81/022; B65D 81/107; B65D 2519/00024; B65D 2519/00059; B65D 2519/00104; B65D 2519/00159; B65D 2519/00174;
(Continued)

(56) References Cited

U.S. PATENT DOCUMENTS 6,105,511 A * 8/2000 Bridges ................ H05K 7/1488
206/320
6,539,881 B2 4/2003 Underbrink et al.
(Continued)

FOREIGN PATENT DOCUMENTS

CN 201712966 U 1/2011
JP 2003175974 A 6/2003

OTHER PUBLICATIONS

Office Action issued to Chinese Counterpart Application No. 201410589555.4 by the SIPO, dated Mar. 3, 2017 along with an English translation (10p).

*Primary Examiner* — Bryon Gehman
(74) *Attorney, Agent, or Firm* — Brinks Gilson & Lione (57) ABSTRACT

A server packing assembly includes a server unit, a pallet unit and an anticollision unit. The server unit includes a rack that includes bottom and top walls and a pair of spaced-apart side walls that interconnect the top and bottom walls and that cooperate with the top and bottom walls to define front and rear openings, and at least one server disposed in the rack. The pallet unit includes a main board supporting the server unit thereon and positioned relative to the rack. The anticollision unit includes a front protector that removably covers the front opening and that is removably coupled to the rack and secured to the pallet unit, and a rear protector that removably covers the rear opening and that is removably coupled to the rack and secured to the pallet unit.

11 Claims, 12 Drawing Sheets

(51) Int. Cl.
  *B65D 81/02* (2006.01)
  *H05K 7/14* (2006.01)
  *B65D 19/00* (2006.01)
  *B65D 81/107* (2006.01)

(52) U.S. Cl.
  CPC .......... *B65D 81/022* (2013.01); *B65D 81/107* (2013.01); *H05K 7/1488* (2013.01); *B65D 2519/00024* (2013.01); *B65D 2519/00059* (2013.01); *B65D 2519/00104* (2013.01); *B65D 2519/00159* (2013.01); *B65D 2519/00174* (2013.01); *B65D 2519/00208* (2013.01); *B65D 2519/00273* (2013.01); *B65D 2519/00288* (2013.01); *B65D 2519/00323* (2013.01); *B65D 2519/00333* (2013.01); *B65D 2519/00373* (2013.01); *B65D 2519/00502* (2013.01); *B65D 2519/00572* (2013.01); *B65D 2519/00611* (2013.01); *B65D 2519/00661* (2013.01); *B65D 2519/00805* (2013.01); *B65D 2519/00815* (2013.01); *B65D 2519/00875* (2013.01); *B65D 2585/6837* (2013.01)

(58) Field of Classification Search
  CPC .......... B65D 2519/00208; B65D 2519/00273; B65D 2519/00288; B65D 2519/00323; B65D 2519/00333; B65D 2519/00373; B65D 2519/00502; B65D 2519/00572; B65D 2519/00611; B65D 2519/00661; B65D 2519/00803; B65D 2519/00815; B65D 2519/00875; B65D 2585/6837; H05K 7/1488
  USPC ........ 206/320, 386, 521, 586–594, 595–600; 312/223.1, 323; 361/679.02, 724–727
  See application file for complete search history.

(56) References Cited

U.S. PATENT DOCUMENTS

| | | | |
|---|---|---|---|
| 7,699,180 B2* | 4/2010 | Mollard | B65D 19/44 211/26 |
| 8,113,478 B2* | 2/2012 | Hsiao | B65D 19/38 312/323 |
| 8,251,467 B2 | 8/2012 | Peng et al. | |
| 8,934,222 B2* | 1/2015 | Kostenko | H05K 7/1488 248/316.5 |
| 2011/0260593 A1* | 10/2011 | Peng | H05K 7/1488 312/293.3 |
| 2015/0129588 A1* | 5/2015 | Cline | B65D 19/0026 206/386 |

* cited by examiner

SERVER PACKING ASSEMBLY

CROSS REFERENCE TO RELATED APPLICATION

This application claims priority of Taiwanese Patent Application No. 103135646 filed on Oct. 15, 2014, the disclosure of which is incorporated herein by reference.

FIELD

The disclosure relates to a server packing assembly, more particularly to a server packing assembly into which an open-type server rack is packed.

BACKGROUND

Open-type server racks were developed and popularized by the open compute project (abbreviated as OCP) started by Facebook, Inc.

Generally, servers are mounted in the open-type server rack as a packing assembly before being delivered to a client by the manufacturer. As a precautionary measure to prevent the servers from being damaged due to any impact received during delivery, the server rack is conventionally secured to a pallet and a plurality of wooden boards are disposed to peripherally surround the rack and cover the top of the rack. The wooden boards are then nailed together to thereby form a protective wooden box around the server rack in cooperation with the pallet. Some buffering materials may be stuffed between the wooden boards and the rack for additional protection of the server.

Since connection between the wooden boards of the wooden box relies only on the nails, the structural strength of the wooden box is relatively weak. Therefore, if the packing assembly accidentally tips over or the delivery vehicle performs an emergency brake during delivery, the wooden box is at the risk of falling apart from impact. Moreover, since the open-type server rack does not have a front casing and a rear casing, when the wooden box is broken apart from impact, the servers are apt to fall out from the rack and suffer damage. On the other hand, the stapling technique for assembly of the wooden box is more complicated and requires a higher level of technical skill.

SUMMARY

Therefore, the object of the disclosure is to provide a server packing assembly that has an improved structural strength and that is able to be easily assembled.

Accordingly, a server packing assembly includes a server unit, a pallet unit and an anticollision unit. The server unit includes a rack that includes a bottom wall, a top wall that is opposite to the bottom wall, and a pair of side walls that are spaced apart from each other, that interconnect the top and bottom walls, and that cooperate with the top and bottom walls to define a front opening and a rear opening, and at least one server disposed in the rack. The pallet unit includes a main board supporting the server unit thereon and positioned relative to the rack. The anticollision unit includes a front protector removably covering the front opening, being removably coupled to the rack, and being removably secured to the pallet unit, and a rear protector removably covering the rear opening, being removably coupled to the rack, and being removably secured to the pallet unit.

BRIEF DESCRIPTION OF THE DRAWINGS

Other features and advantages of the disclosure will become apparent in the following detailed description of the preferred embodiment with reference to the accompanying drawings, of which.

DETAILED DESCRIPTION OF THE PREFERRED EMBODIMENT

Referring to FIGS. 1 to 4, an embodiment of a server packing assembly according to the present invention includes a server unit 1, a pallet unit 2, and an anticollision unit 3.

The server unit 1 includes a rack 11 and at least one server 12 disposed in the rack 11. In this embodiment, there are a plurality of the servers 12 disposed in the rack 11. The rack 11 has a bottom wall 112, a top wall 111 that is opposite to the bottom wall 112, and a pair of sidewalls 113. The pair of side walls 113 are spaced apart from each other and interconnect the top and bottom walls 111, 112. Each of the side walls 113 includes a front wall portion 113a and a rear wall portion 113b that are spaced apart from each other. The front wall portions 113a of the side walls 113, the top wall 111 and the bottom wall 112 cooperate to define a front opening 114. The rear wall portions 113b of the side walls 113, the top wall 111 and the bottom wall 112 cooperate to define a rear opening 115.

Figure 5:
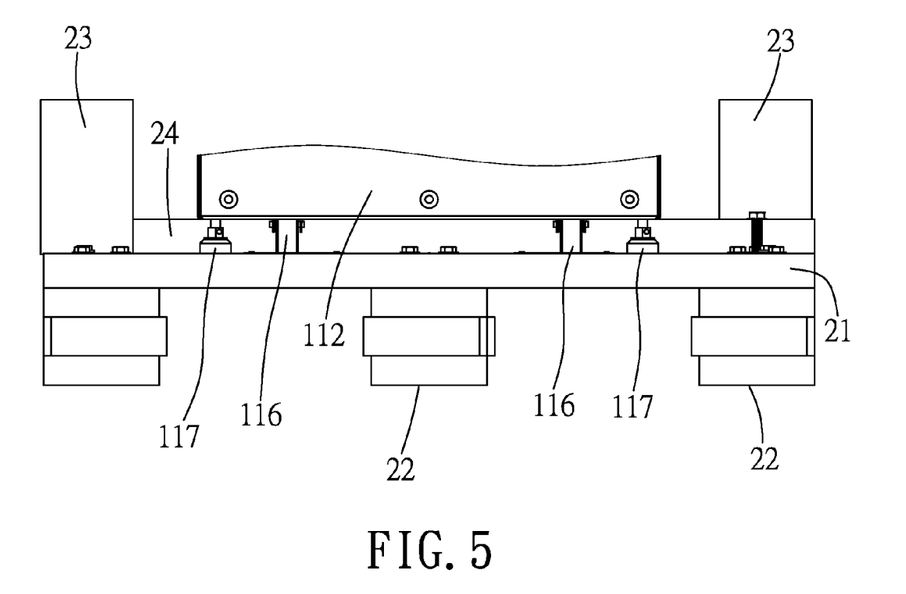
FIG. 5 is a fragmentary side view illustrating a relative relationship between a wheel set of a rack and a pallet unit of the embodiment.

Referring to FIG. 5, the rack 11 further includes a plurality of wheel sets 116 mounted on a bottom side of the bottom wall 112, and a plurality of telescopic support legs 117 disposed between the bottom side of the bottom wall 112 and the pallet unit 2. The wheel sets 116 are divided into left and right groups. Each group includes a plurality of wheels arranged in a front-rear direction. In this embodiment, there are four of the wheel sets 116 and four of the telescopic support legs 117, and each of the right and left groups includes two of the wheel sets 116. Each of the wheel sets 116 and a corresponding one of the telescopic support legs 117 are mounted proximate to a corresponding one of four corners of the bottom side of the bottom wall 112. When the telescopic support legs 117 ascend and are retracted toward the bottom wall 112 to be positioned closer to the bottom wall 112 than the wheel sets 116, the wheel sets 116 abut against the pallet unit 2 for easy moving of the rack 11. When the rack 11 is desired to be immobilized, the telescopic support legs 117 descend and are extended toward the pallet unit 2 to be positioned closer to the pallet unit 2 than the wheel sets 116. Thereby, the wheel sets 116 are away from the support surface and the rack 11 is rendered immobile.

Figure 6:
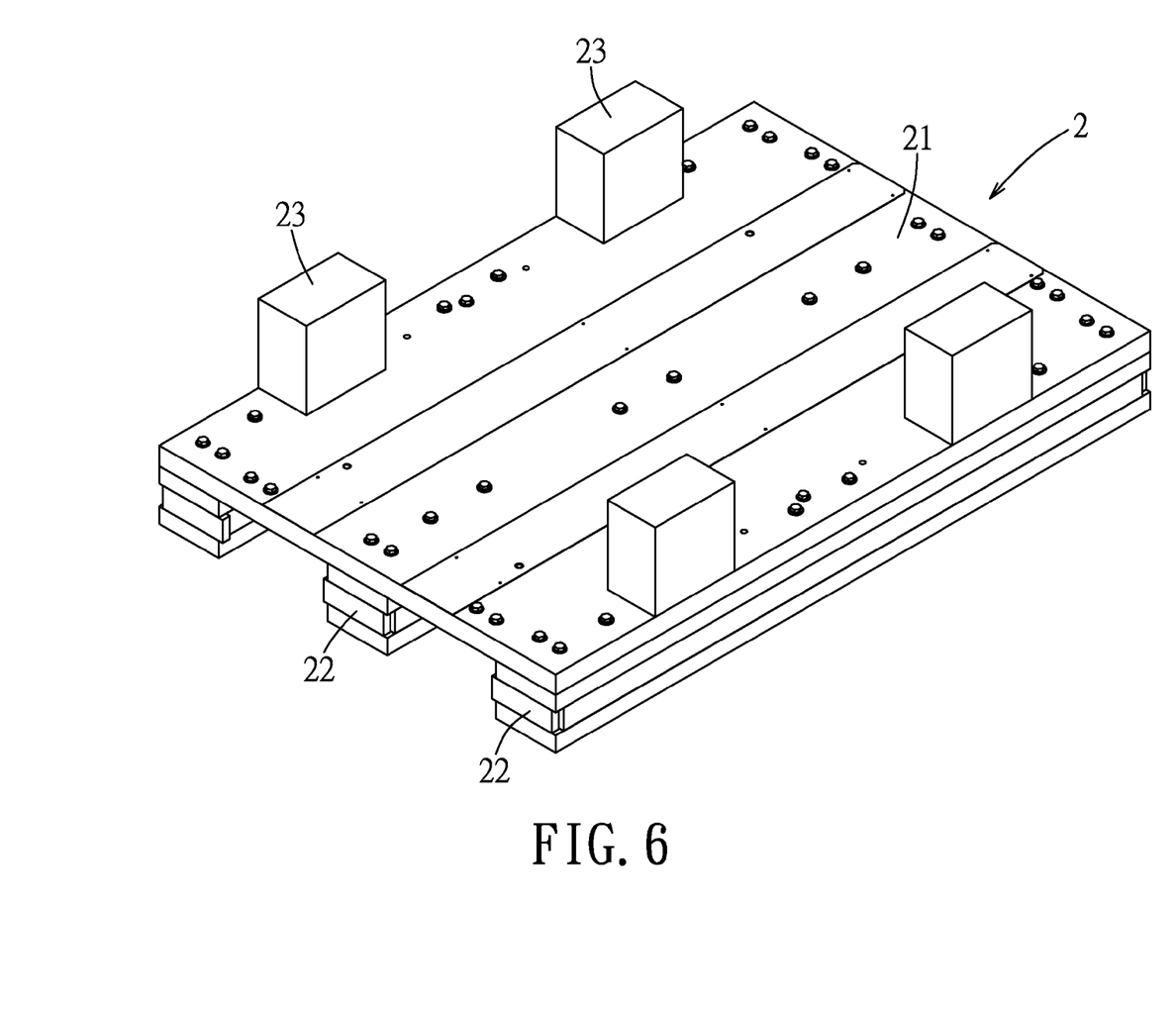
FIG. 6 is a perspective view illustrating the pallet unit of the embodiment.
Figure 7:
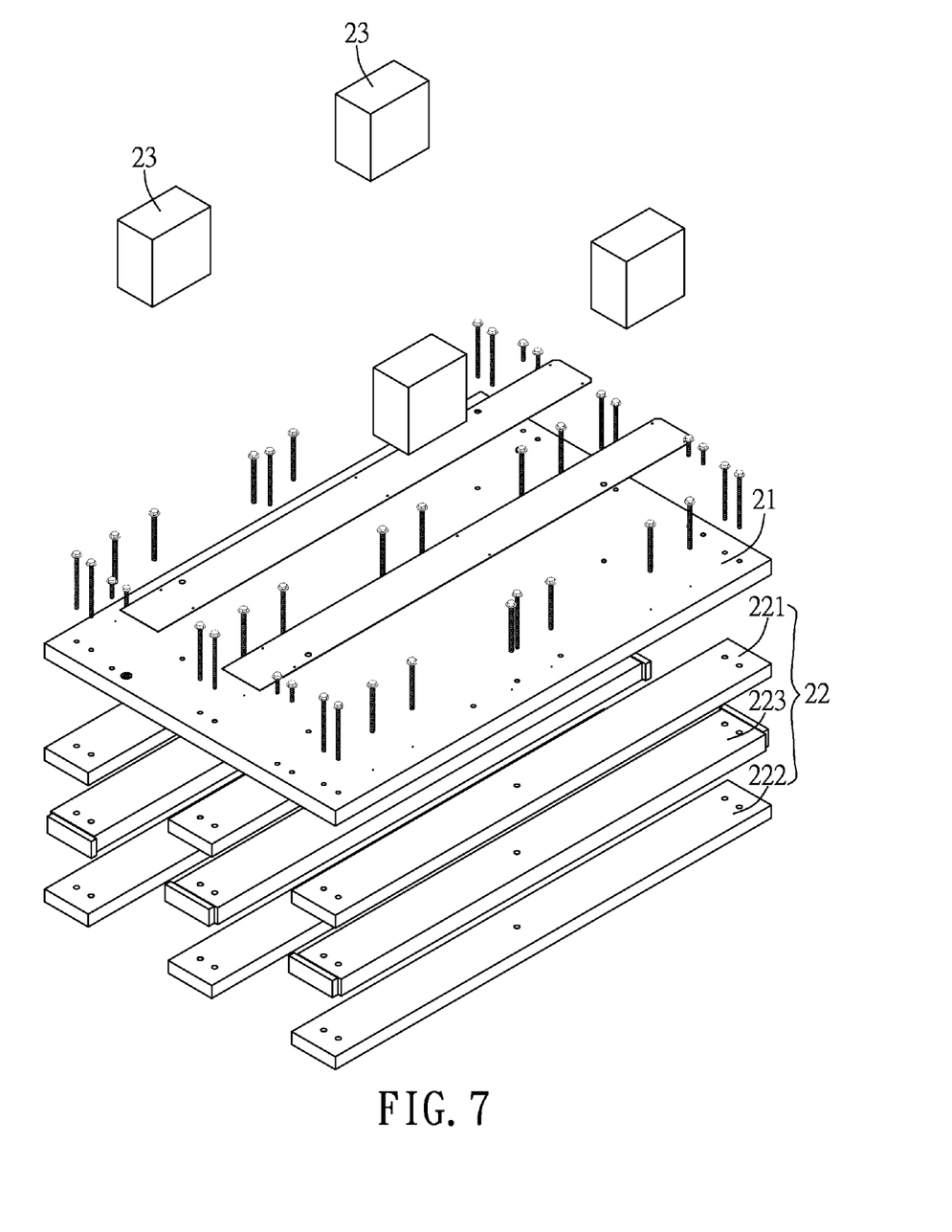
FIG. 7 is an exploded perspective view illustrating an assembling arrangement of the pallet unit of the embodiment.

Referring to FIGS. 6 and 7, the pallet unit 2 supports the server unit 1 (see FIG. 3) and is positioned relative to the rack 11. The pallet unit 2 includes a main board 21 that supports the server unit 1 thereon and that is positioned relative to the rack 11, three soles 22 mounted on a bottom side of the main board 21 and extending in a front-rear direction, and at least one shock absorbing device 23 mounted on the main board 21 for absorbing external vibration energy. In this embodiment, the pallet unit 2 includes four of the shock absorbing devices 23. Each of the soles 22 includes a top layer 221, a bottom layer 222 and a buffer layer 223 sandwiched between the top layer 221 and the bottom layer 222. The main board 21 and the top layers 221 and the bottom layers 222 of the soles 22 may be made of a metallic material with relatively high rigidity. The buffer layers 223 of the soles 22 may be made of a buffering material for absorbing external vibration energy, such as expanded polyethylene (EPE) foams.

The shock absorbing devices 23 are designed according to the weight of the server unit 1 carried thereon and appropriate weight, damping modulus and elasticity modulus of the shock absorbing devices 23 are chosen based on theoretical calculations for absorbing the excess external vibration energy and preventing the external vibration energy from being transferred and become damaging to the server unit 1. In this embodiment, each of the shock absorbing devices 23 is a counterweight, which is composed of a single block or a stack of plates. However, the number of the at least one shock absorbing device 23 is not limited by this embodiment and is adjustable according to practical requirements.

Referring back to FIGS. 4 and 5, when the rack 11 is assembled with the pallet unit 2, the rack 11 is moved onto the main board 21 and then the telescopic support legs 117 of the rack 11 are extended to abut against the main board 21 with a plurality of securing bars 24 disposed between the bottom wall 112 of the rack 11 and the main board 21. Thereby, the rack 11 and the main board 21 are positioned relative to each other and sliding of the rack 11 in the front-rear direction is prevented.

Referring to FIGS. 8 to 10 and FIGS. 1 to 4, the anticollision unit 3 includes a front protector 31, a rear protector 32, a plurality of holders 33 and a soft cover 34. The front protector 31 removably covers the front opening 114 of the rack 11, is removably coupled to the rack 11, and is removably secured to the pallet unit 2. The rear protector 32 removably covers the rear opening 115 of the rack 11, is removably coupled to the rack 11, and is removably secured to the pallet unit 2. In this embodiment, the front protector 31 and the rear protector 32 are screwedly coupled to the rack 11, and are connected and secured to the pallet unit 2 through the holders 33.

Figure 8:
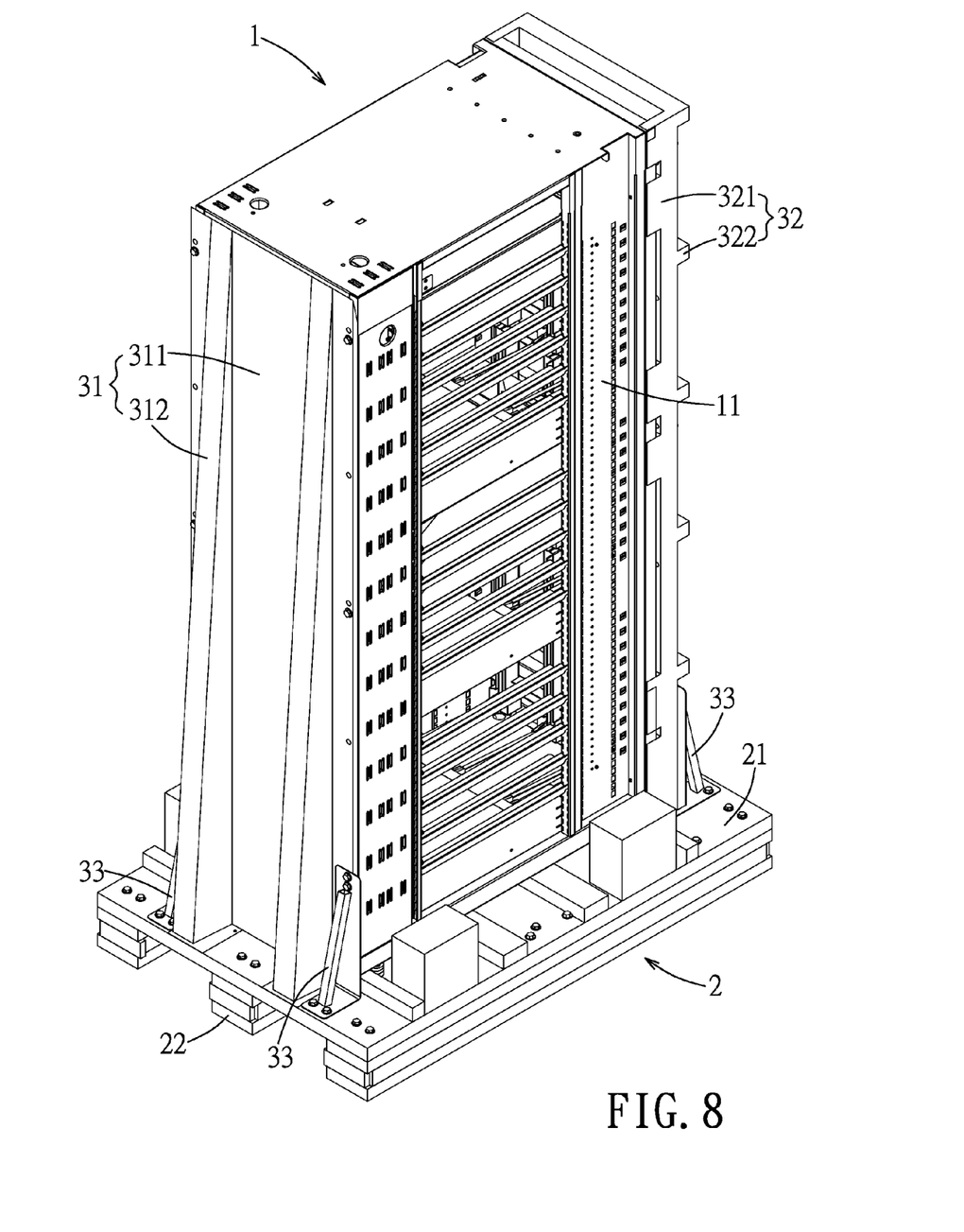
FIG. 8 is a perspective view illustrating an assembling relationship between a front protector of the rack and the pallet unit of the embodiment.
Figure 9:
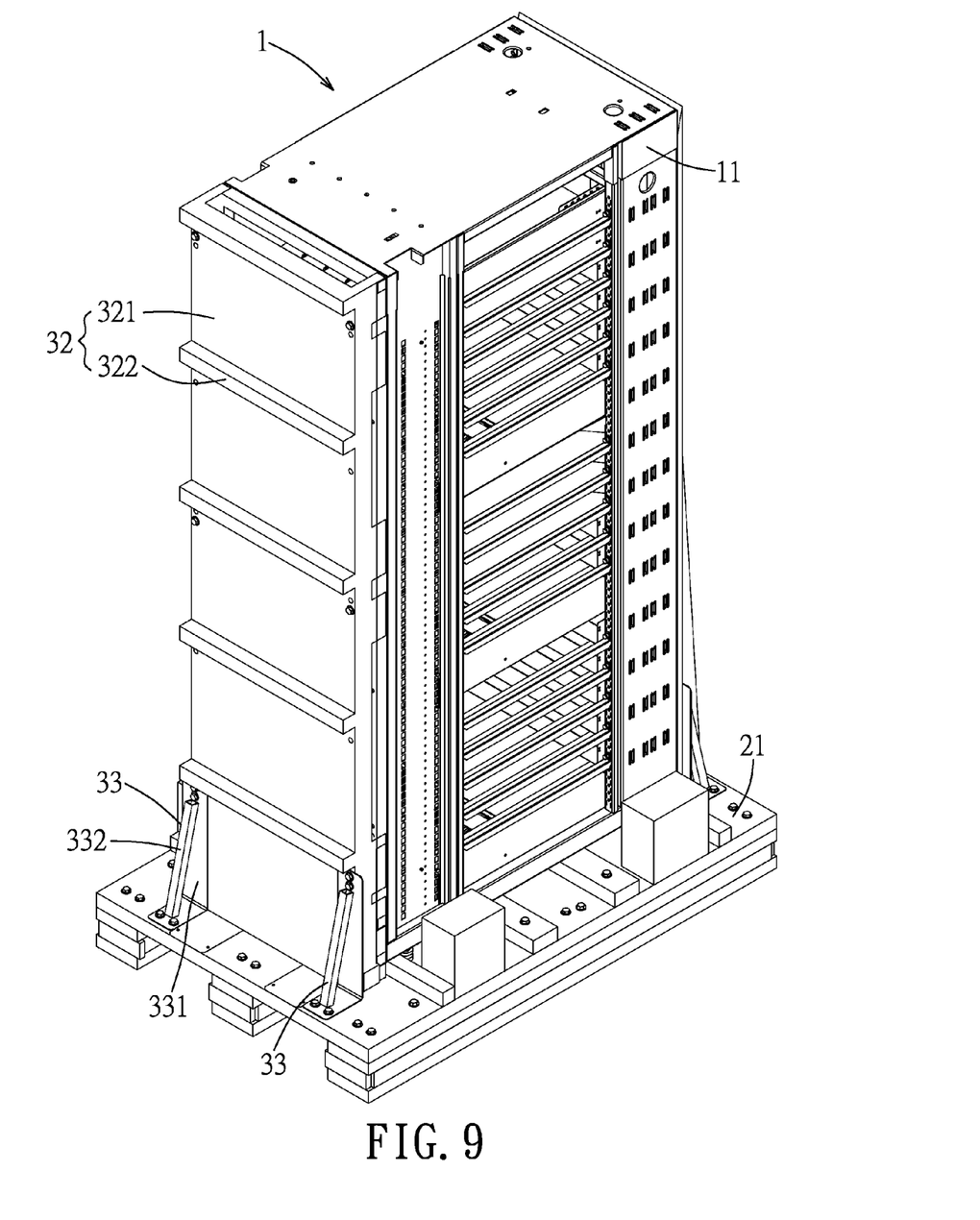
FIG. 9 is a perspective view illustrating an assembling relationship between a front protector of the rack and the pallet unit of the embodiment.
Figure 10:
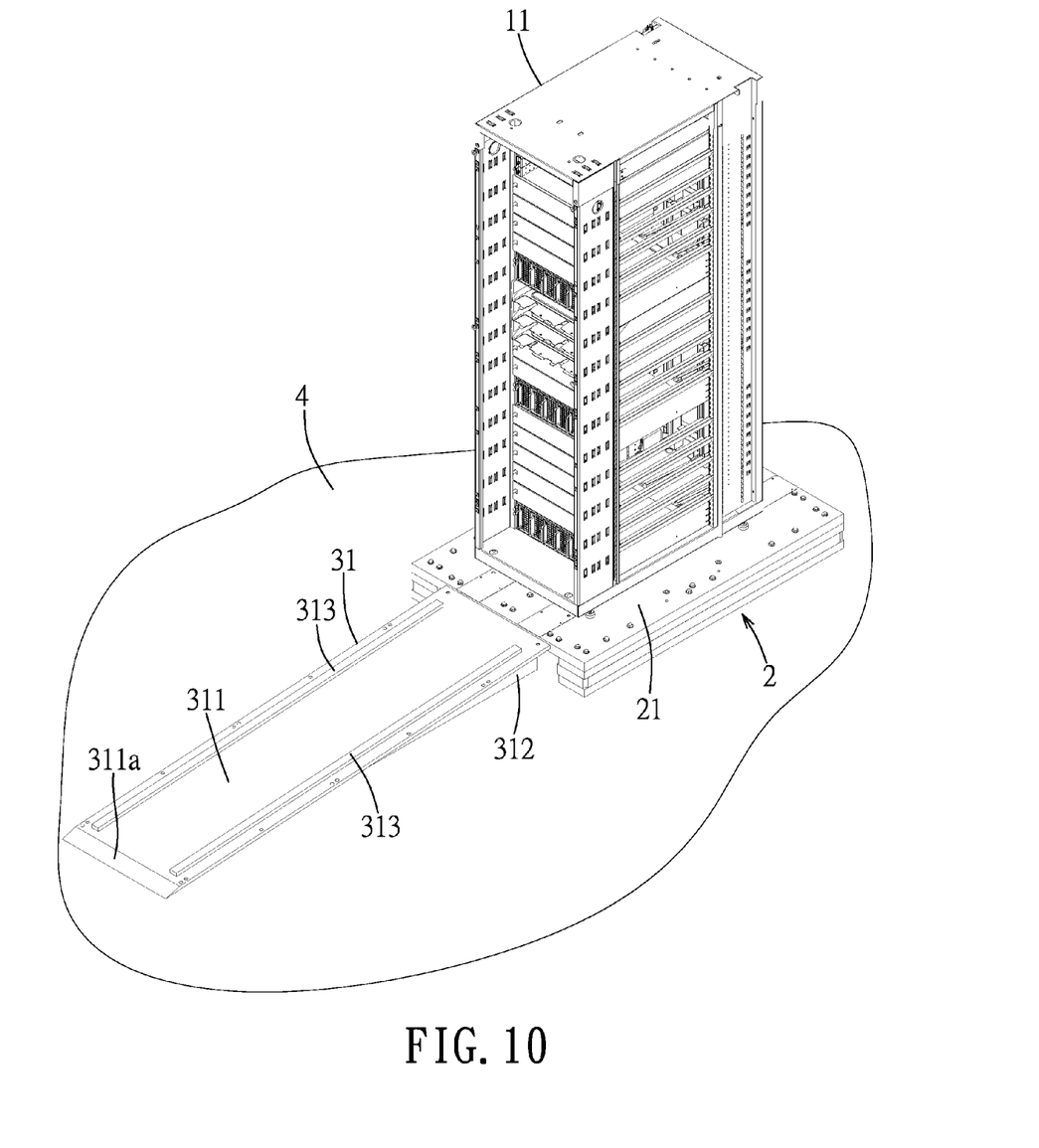
FIG. 10 is a perspective view illustrating the front protector of the embodiment in a removed position.

The front protector 31 includes a board body 311 removably covering the front opening 114, at least one wedge pad 312, and a pair of the guide rails 313. In this embodiment, the front protector 31 includes a pair of the wedge pads 312. The wedge pads 312 are mounted on a side of the board body 311 and extend in a top-bottom direction. The front protector 31 is displaceable relative to the rack 11 between a covering position, where the board body 311 covers the front opening 114 and the wedge pads 312 is opposite to the front opening 114, and a removed position, where the front protector 31 is placed on the ground 4 adjacent to the pallet unit 2 and cooperates with the pallet unit 2 to form a slope for unloading the rack 11 from the pallet unit 2 to the ground 4.

In this embodiment, when the front protector 31 is in the covering position, each of the wedge pads 312 has a thickness that gradually increases from an end proximate to the top wall 111 of the rack 11 to an end proximate to the bottom wall 112 of the rack 11 so that when the front protector 31 is removed from the top wall 111 of the rack 11 and laid down forward to be in the removed position, the front protector 31 is placed in front of the pallet unit 2 and connected therewith. That is to say, when the front protector 31 is connected to the pallet unit 2 in the removed position, a top surface of the board body 311 of the front protector 31 is close to a topside of the main board 21 of the pallet unit 2, and the board body 311 inclines from the main board 21 to the ground 4 to form a slope. Moreover, it is comprehensible that the pair of wedge pads 312 is replaceable with a wedge pad 312 of a relatively large size to form the slope.

The pair of guide rails 313 are mounted on a side of the board body 311 and parallelly spaced apart from each other. The guide rails 313 face the front opening 114 and extend in the top-bottom direction when the front protector 31 is in the covering position. The wheel sets 116 of the left and right groups are guided to move between the guide rails 313 on the slope formed by the board body 311 when the front protector 31 is in the removed position so as to prevent the rack 11 from falling out sidewise of the boardbody 311 during the displacement. Furthermore, the board body 311 of the front protector 31 has a bevelled surface 311a that extends to the ground 4 from the board body 311 on the side mounted with the guide rails 313 when the front protector 31 is in the removed position. In this embodiment, the bevelled surface 311a is proximate to the top wall 111 of the rack 11 and is formed by tapering the thickness of the board body 311 toward a top edge of the board body 311 when the front protector 31 is in the covering position, so as to allow the top edge of the board body 311 in contact with the ground 4 to be more level with the ground 4 when in the removed position, so that the wheel sets 116 of the rack 11 may smoothly pass over the interface between the board body 311 and the ground 4.

The rear protector 32 includes a main body 321 removably covering the rear opening 115, and a plurality of ribs 322 that are mounted on a side of the main body 321 opposite to the rear opening 115, that are spaced apart from each other and that extend along the left-right direction.

Some of the holders 33 removably connect the front protector 31 and the main board 21, and the others of the holders 33 removably connect the rear protector 32 and the main board 21. In this embodiment, there are four of the holders 33. Two of the holders 33 are adapted to respectively abut against and support the board body 311 of the front protector 31 at the left and right portions of the side of the board body 311 provided with the wedge pads 312, and the other two holders 33 respectively abut against and support the board body 311 at the left and right portions of the side of the board body 311 of the rear protector 32 provided with the ribs 322. Each of the holders 33 has an L-shaped connection portion 331 with two arms and a rod 332 connected between the two arms. The two arms of the connection portion 331 are respectively secured to the main board 21 and a corresponding one of the front protector 31 and the rear protector 32. The two arms of the L-shaped connection portion 331 and the rod 332 are cooperated to form a substantially right triangular configuration. The soft cover 34 covers the top wall 111 and the sidewalls 113.

Figure 1:
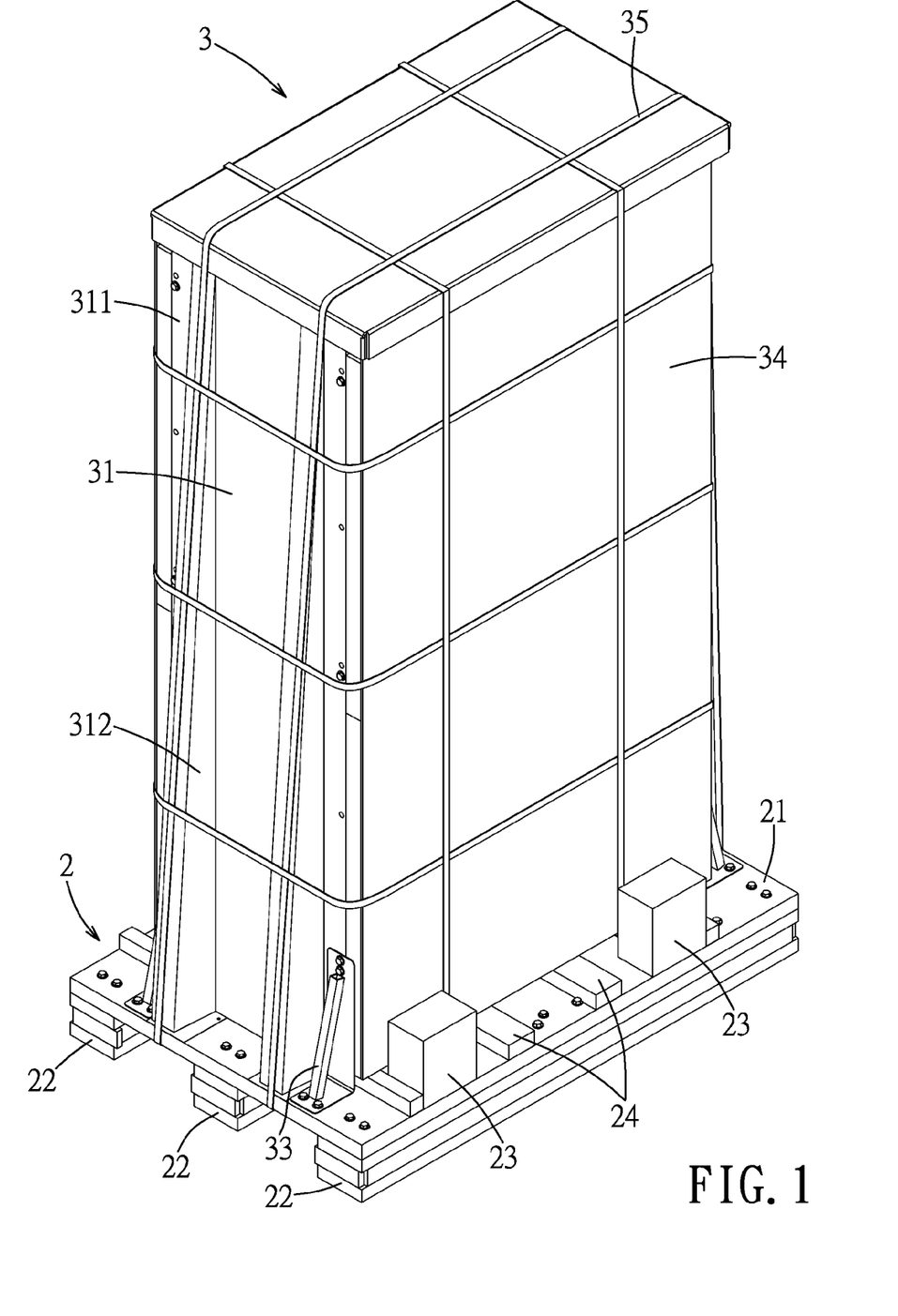
FIG. 1 is a perspective view illustrating an embodiment of a server packing assembly according to the disclosure.
Figure 2:
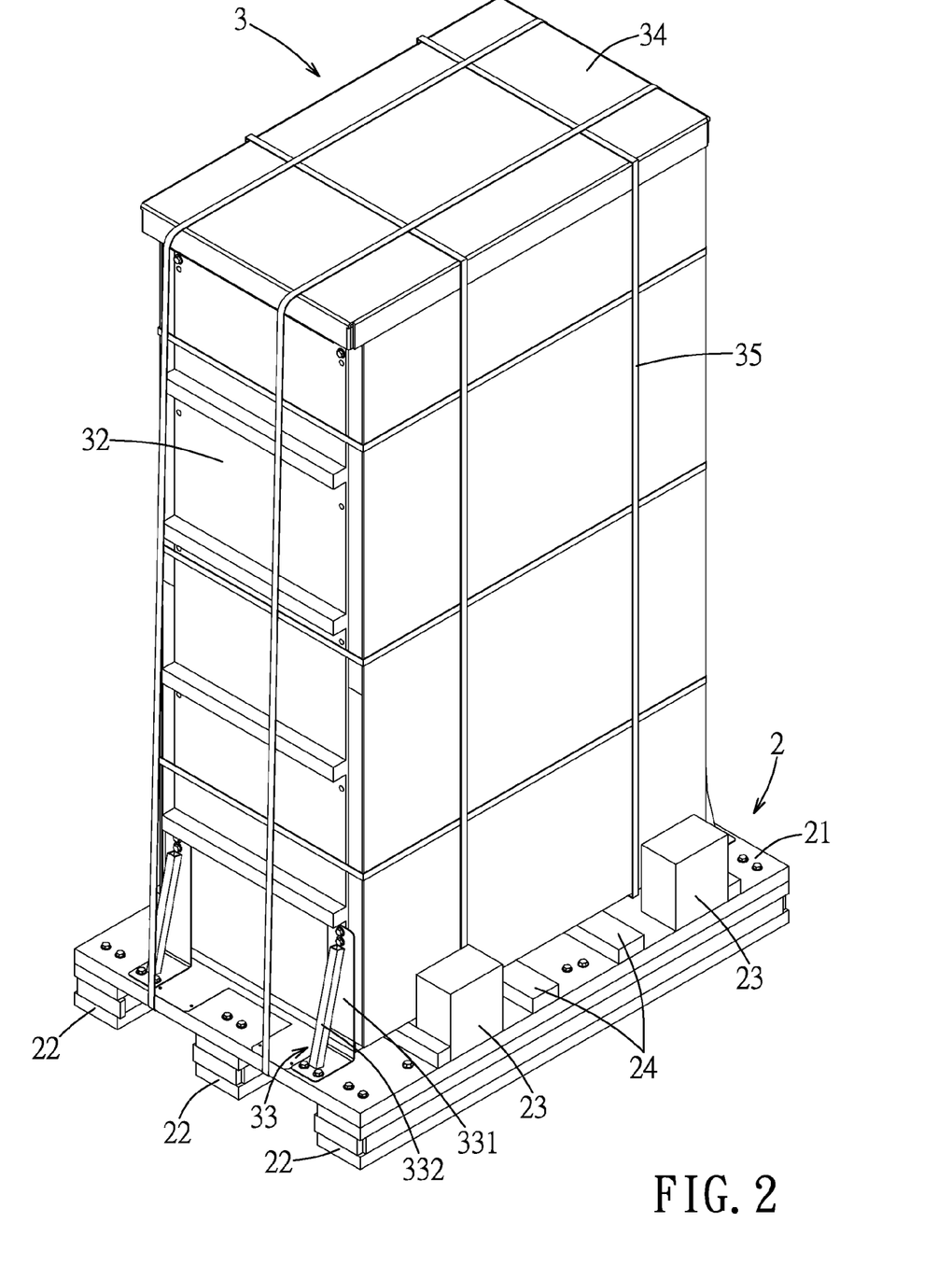
FIG. 2 is a perspective view illustrating the embodiment, which is similar to FIG. 1 and taken from another viewing angle.
Figure 3:
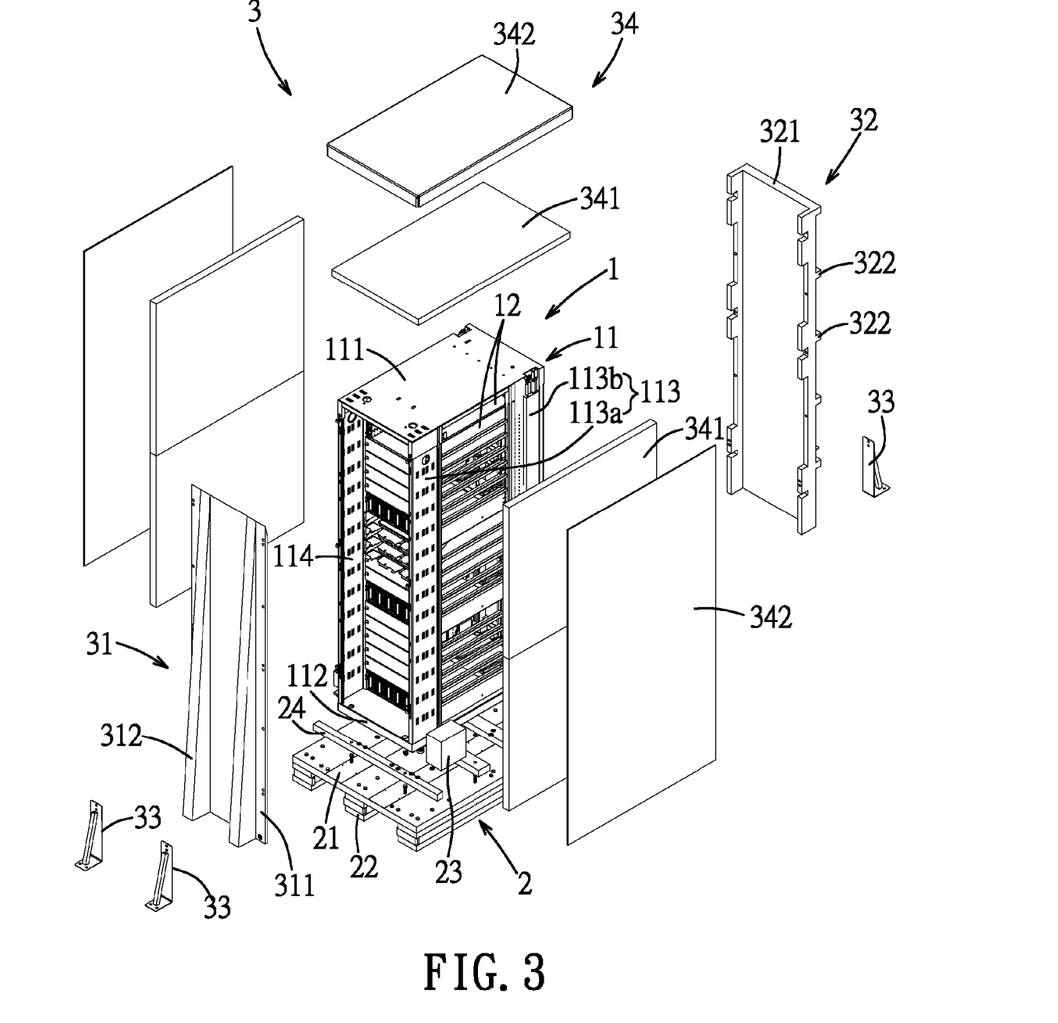
FIG. 3 is an exploded perspective view illustrating an assembling arrangement of the embodiment.
Figure 4:
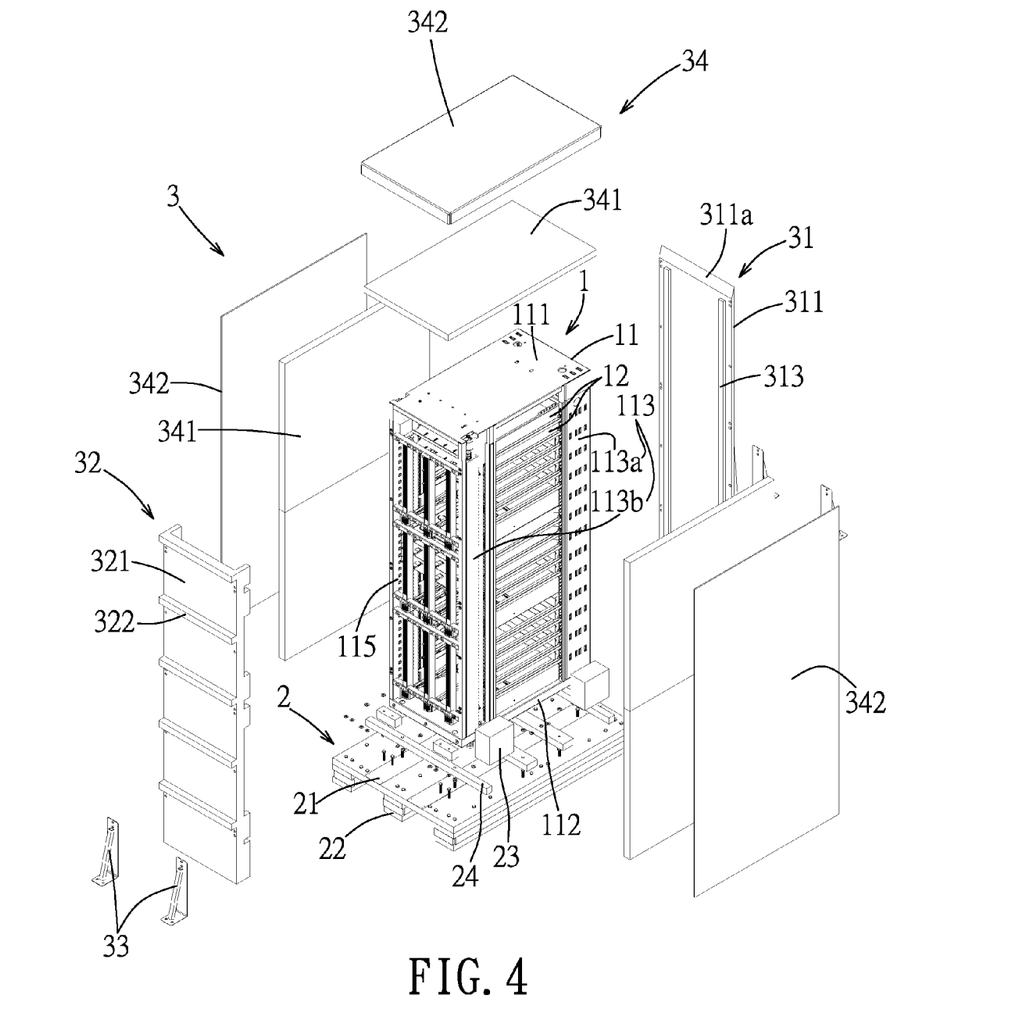
FIG. 4 is an exploded perspective view illustrating the embodiment, which is similar to FIG. 3 and taken from another viewing angle.

In this embodiment, the soft cover 34 includes a foam layer 341 and a paper-board layer 342. The foam layer 341 covers the top wall 111 and the sidewalls 113 of the server unit 1 and is overlaid with the paper-board layer 342. The server unit 1 covered by the soft cover 34 and the pallet unit 2 are tied together by ropes 35 for extra security.

Since the front protector 31 and the rear protector 32 are directly screwedly coupled to the rack 11 and cover the front opening 114 and the rear opening 115, respectively, they are capable of cooperating with the rack 11 to form a main structure of the server packing assembly. By using the rack 11 having a frame made from a metallic material to provide an improved structural strength with less potential for deformation, in combination with the covering of the front opening 114 and the rear opening 115 with the front protector 31 and the rear protector 32, respectively, and the connection and securing of the front protector 31 and the rear protector 32 to the pallet unit 2 through the holders 33, the servers 12 disposed in the rack 11 are prevented from falling out from the front opening 114 or the rear opening 115 during delivery.

During delivery of the server packing assembly, the rack 11 tends to move due to inertia when the delivery vehicle starts moving or abruptly halts. Abutment of the holders 33 against the front protector 31 and the rear protector 32 not only enhances the connection strength of the front protector 31 and the rear protector 32 with the rack 11, but the risk of the rack 11 to sliding or tipping over is also reduced. Moreover, since the rack 11 per se serves as the main rigid support structure of the overall server packing assembly, outer surfaces of the top wall 111 and the sidewalls 113 are not required to have any additional support structures, and application of the soft cover 34 thereto for avoiding scratches, contamination or dust is sufficient. Besides, since the front protector 31 and the rear protector 32 are adapted to be directly coupled to the rack 11, covering the rack 11 with the soft cover 34 and tying up the assembly is all that is required for delivery. The technical requirement for completing the server packing assembly of the disclosure is lower than that required for the conventional packing assembly, which involves assembling with wooden boards and nails. That is to say, the server packing assembly of the disclosure is relatively easy to assemble.

Besides using the rack 11 per se as the main rigid support structure of the overall server packing assembly instead of the conventional wooden box with relatively low structural strength, this embodiment further utilizes the shock absorbing devices 23 of the pallet unit 2 and the buffer layers 223 of the soles 22 to absorb external vibration energy so as to reduce transfer of the vibration energy into the rack 11 and so as to avoid the damage of the servers 12 disposed in the rack 11. The function of external vibration energy absorption is also achievable by the pallet unit 2 that includes only one of the shock absorbing devices 23 and the buffer layers 223.

Figure 11:
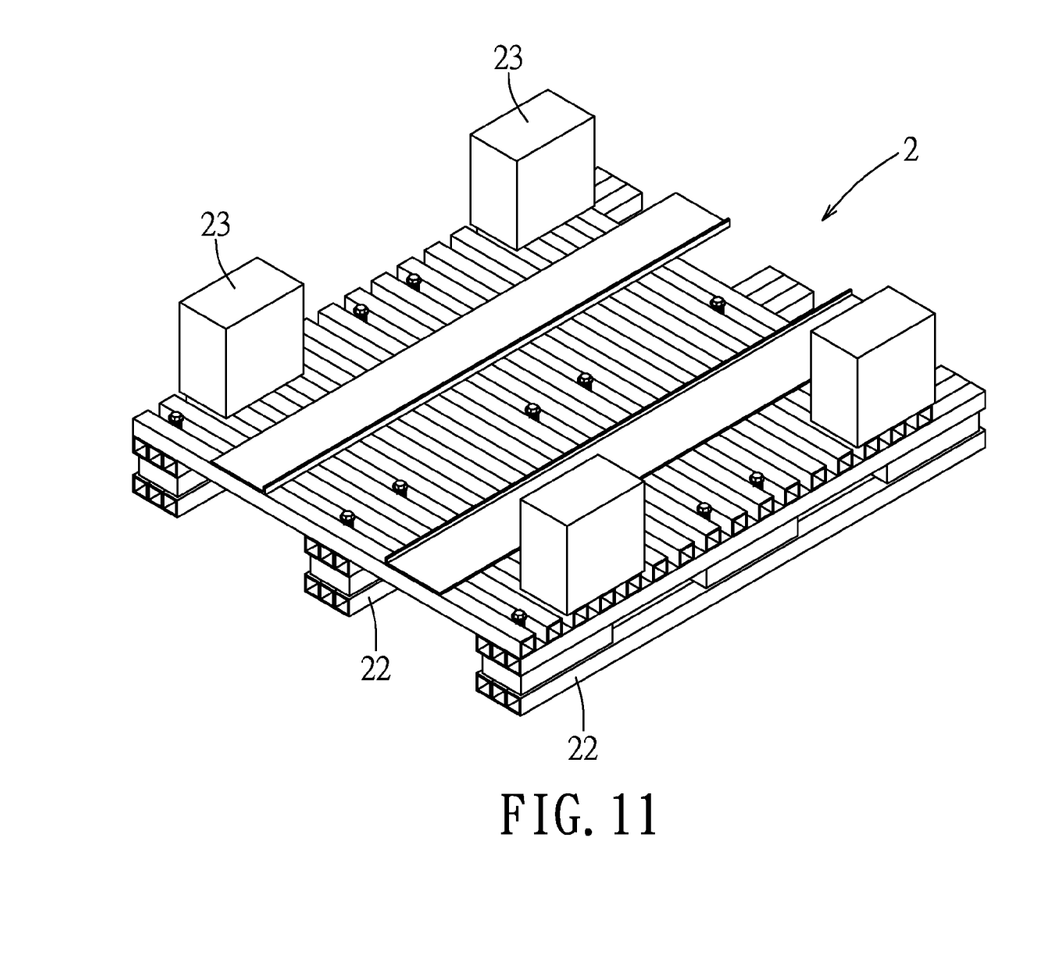
FIG. 11 is a perspective view illustrating another configuration of the pallet unit of the embodiment of the server packing assembly according to the disclosure.
Figure 12:
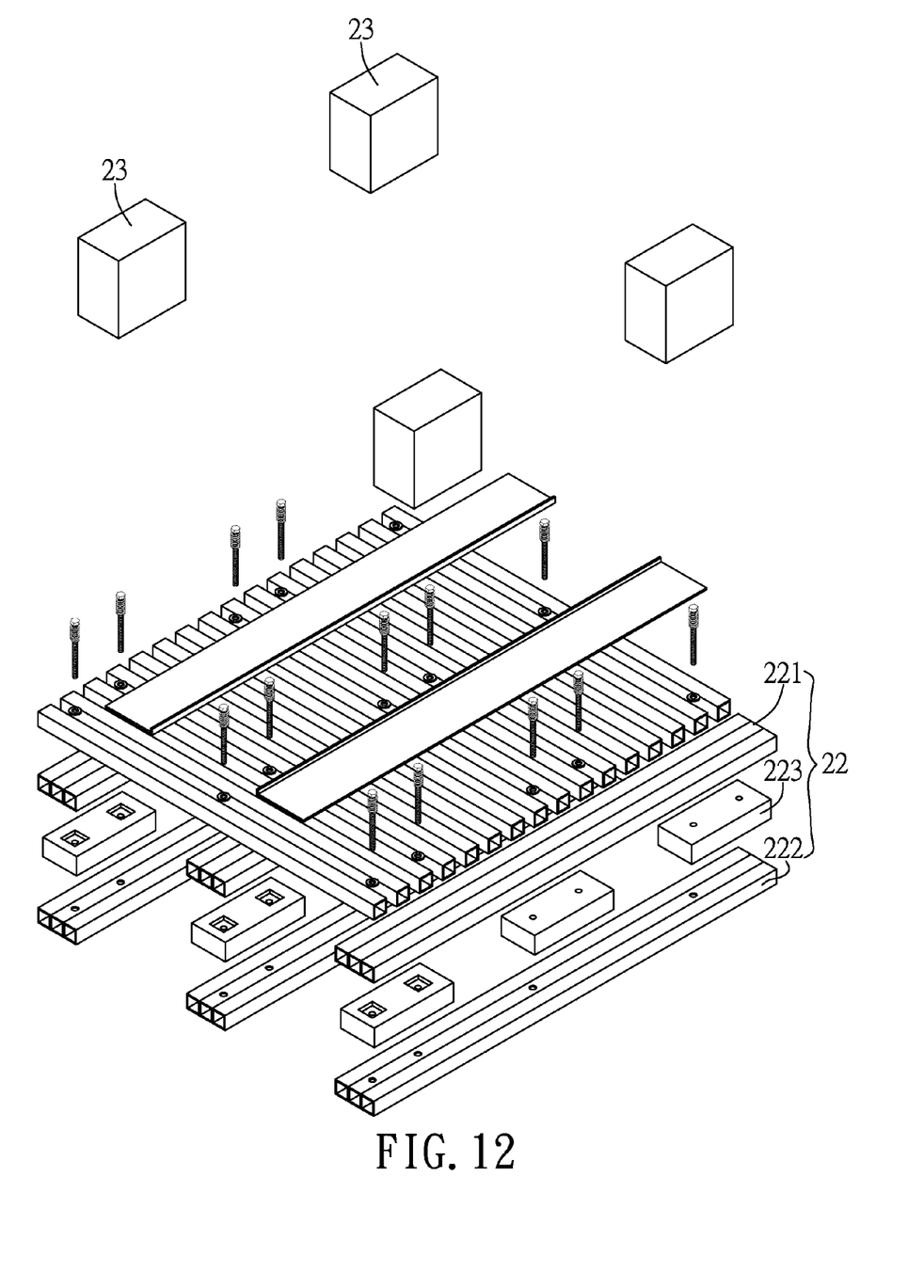
FIG. 12 is an exploded perspective view illustrating the assembling arrangement of the pallet unit of FIG. 11.

Referring to FIGS. 11 and 12, another configuration of the pallet unit 2 is illustrated. In this configuration, the buffer layer 223 of each of the soles 22 is composed of a plurality of blocks. The main board 21 and the top and bottom layer 221, 222 of each of the soles 22 are formed by hollow metal bars assembled together so as to reduce weight.

In view of the foregoing, this embodiment uses the rack 11 per se as the main rigid support structure of the overall server packing assembly, which not only greatly improves the structural strength thereof, but also simplifies the assembling of the overall server packing assembly. Moreover, the front protector 31 can serve as a slope for moving the rack 11 from the pallet unit 2 to the ground 4. Furthermore, the pallet unit 2 has the function of external vibration energy absorption so as to reduce transfer of the vibration energy into the rack 11 and so that damage to the servers 12 disposed in the rack 11 is avoided.

While the present invention has been described in connection with what is considered the exemplary embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A server packing assembly comprising:
    a server unit that includes
        a rack including a bottom wall, a top wall that is opposite to said bottom wall, and a pair of side walls that are spaced apart from each other, that interconnect said top and bottom walls, and that cooperate with said top and bottom walls to define a front opening and a rear opening, and
        at least one server disposed in said rack;
    a pallet unit that includes a main board supporting said server unit thereon and positioned relative to said rack; and
    an anticollision unit that includes
        a front protector removably covering said front opening, being removably coupled to said rack, and being removably secured to said pallet unit, and
        a rear protector removably covering said rear opening, being removably coupled to said rack, and being removably secured to said pallet unit,
        wherein said front protector is displaceable relative to said rack between a covering position, where said front protector covers said front opening, and a removed position, where said front protector is placed on the ground adjacent to said pallet unit and cooperates with said pallet unit to form a slope for unloading said rack from said pallet unit.

2. The server packing assembly as claimed in claim 1, wherein said front protector includes:
    a board body removably covering said front opening; and
    at least one wedge pad mounted on a side of said board body, said board body covering said front opening and said at least one wedge pad being opposite to said front opening when said front protector is at the covering position.

3. The server packing assembly as claimed in claim 2, wherein:
    said rack further includes a plurality of wheel sets mounted on a bottom of said bottom wall, said wheel sets being divided into left and right groups, each group including a plurality of wheels arranged in front-to-rear direction; and
    said front protector further includes a pair of parallel guide rails mounted on a side of said board body and spaced apart from each other, said guide rails facing said front opening when said front protector is in the covering position, said two groups of said wheel sets are guided to move between said guide rails when said front protector is in the removed position.

4. The server packing assembly as claimed in claim 3, wherein said board body of said front protector has a bevelled surface that extends from said side of said board body which is mounted with said guide rails to the ground when said front protector is in the removed position.

5. The server packing assembly as claimed in claim 3, wherein said anticollision unit further includes a plurality of holders, some of said holders removably connecting said front protector and said main board, the others of said holders removably connecting said rear protector and said main board.

6. The server packing assembly as claimed in claim 5, wherein said rear protector includes a main body removably covering said rear opening, and a plurality of ribs that are mounted on a side of said main body opposite to said rear opening, that are spaced apart from each other, and that extend along a left-right direction.

7. The server packing assembly as claimed in claim 6, wherein each of said side walls includes a front wall portion and a rear wall portion that are spaced apart from each other, said front wall portions of said side walls, said top wall and said bottom wall cooperating to define said front opening, said rear wall portions of said side walls, said top wall and said bottom wall cooperating to define said rear opening, said anticollision unit further including a soft cover that covers said side walls.

8. The server packing assembly as claimed in claim 1, wherein said pallet unit further includes at least one shock absorbing device mounted on said main board.

9. The server packing assembly as claimed in claim 8, wherein said pallet unit further includes three soles mounted on a bottom side of said main board and extending in a front-to-rear direction, each of said soles including a top layer, a bottom layer and a buffer layer that is sandwiched between said top layer and said bottom layer.

10. The server packing assembly as claimed in claim 8, wherein said at least one shock absorbing device is a counterweight.

11. The server packing assembly as claimed in claim 1, wherein said pallet unit further includes three soles mounted on a bottom side of said main board and extending in a front-to-rear direction, each of said soles including a top layer, a bottom layer and a buffer layer that is sandwiched between said top layer and said bottom layer.

* * * * *